United States Patent
Stahl et al.

(10) Patent No.: US 7,502,882 B2
(45) Date of Patent: Mar. 10, 2009

(54) ADVANCED MEZZANINE CARD ADAPTER

(75) Inventors: Douglas Lee Stahl, Phoenix, AZ (US); David R. Formisano, Chandler, AZ (US); Andy Saffarian, Chandler, AZ (US); Marwan Khoury, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 11/079,627

(22) Filed: Mar. 14, 2005

(65) Prior Publication Data

US 2006/0206647 A1     Sep. 14, 2006

(51) Int. Cl.
*G06F 13/00* (2006.01)
*H01R 12/00* (2006.01)

(52) U.S. Cl. ............... 710/301; 710/315; 439/65

(58) Field of Classification Search ......... 710/301, 710/302, 105, 305, 306, 315; 439/59, 65, 439/945
See application file for complete search history.

(56) References Cited

U.S. PATENT DOCUMENTS

| | | | | |
|---|---|---|---|---|
| 5,201,038 | A * | 4/1993 | Fielder | 710/100 |
| 5,583,749 | A * | 12/1996 | Tredennick et al. | 361/790 |
| 5,611,057 | A * | 3/1997 | Pecone et al. | 710/301 |
| 5,802,333 | A * | 9/1998 | Melvin | 710/316 |
| 5,887,145 | A * | 3/1999 | Harari et al. | 710/301 |
| 6,477,593 | B1 * | 11/2002 | Khosrowpour et al. | 710/100 |
| 6,702,590 | B2 * | 3/2004 | Zaderej et al. | 439/74 |
| 6,805,560 | B1 * | 10/2004 | Budny et al. | 439/65 |
| 6,935,868 | B1 * | 8/2005 | Campini et al. | 439/67 |
| 6,983,385 | B2 * | 1/2006 | German et al. | 713/300 |
| 7,082,487 | B2 * | 7/2006 | Darwish et al. | 710/301 |
| 7,101,188 | B1 * | 9/2006 | Summers et al. | 439/59 |
| 7,159,062 | B2 * | 1/2007 | Byers et al. | 710/305 |
| 2003/0235042 | A1 | 12/2003 | Harris et al. | |
| 2006/0221559 | A1 * | 10/2006 | Campini et al. | 361/679 |
| 2006/0221590 | A1 * | 10/2006 | Campini et al. | 361/803 |
| 2006/0223343 | A1 * | 10/2006 | Campini et al. | 439/64 |

FOREIGN PATENT DOCUMENTS

EP           1376375 A2        1/2004

(Continued)

OTHER PUBLICATIONS

CompactPCI Perspective, Advanced Mezzanine Card (AdvancedMC): Revolution, not Evolution, CompactPCI System, Jan. 2004.*

(Continued)

*Primary Examiner*—Khanh Dang
(74) *Attorney, Agent, or Firm*—Grossman, Tucker, Perreault & Pfleger, PLLC

(57) ABSTRACT

An Advanced Mezzanine Card (AMC) adapter may be used to connect a non-AMC mezzanine card to an AMC carrier. The AMC adapter may include a card edge connector configured to be connected to an AMC connector on the AMC carrier and one or more mezzanine connectors configured to be connected to the non-AMC mezzanine card. The AMC adapter may also include a bridge to convert between communication protocols used by the non-AMC mezzanine card and the AMC carrier. Of course, many alternatives, variations, and modification are possible without departing from this embodiment.

19 Claims, 3 Drawing Sheets

FOREIGN PATENT DOCUMENTS

| | | |
|---|---|---|
| WO | 0155868 A1 | 8/2001 |
| WO | 2006099562 A2 | 9/2006 |
| WO | 2006099562 A3 | 9/2006 |

OTHER PUBLICATIONS

PEX 8111 ExpressLane PCI Express to PCI Bridge, version 1.4, 2005.*
Advanced Mezzanine Card (AdvancedMC) and PCI Express, CompactPCI System, Jan. 2004.*
Definition of AMC Mezzanine Bus by Interfacebus.com.*
Definition of Daughterboard from Wikipedia.*
Definition of PCI Mezzanine Card by Wikipedia, unknown date.*
Advanced Mezzanine Card, Mark Summers, PCI Industrial Computers, undated.*
Advanced Mezzanine Card (AdvancedMC) for PCI Express, PLX Technology, Inc. Apr. 2005.*
Specification Corner, Usage Models for Advanced Mezzanine Card (AdvancedMC), CompactPCI System, Nov. 2003.*
"Advanced Mezzanine Card Short Form Specification", *PICMG AMC.0*, (Jun. 15, 2004), 57 pgs.
"Bridging up to PCI Express from PCI", *Intel in Communications, White Paper*, Copyright 2003, 12 pgs.
International Search Report and Written Opinion thereof dated Oct. 12, 2006 issued in corresponding PCT patent application No. PCT/US2006009619 (11 pages).

* cited by examiner

ADVANCED MEZZANINE CARD ADAPTER

FIELD

The present disclosure relates to an Advanced Mezzanine Card (AMC) adapter for connecting non-AMC mezzanine cards to an AMC carrier.

BACKGROUND

In computer systems, computer component cards may be connected to a single base or carrier card that plugs into the computer bus or data path. The component cards may be stacked on the base or carrier card and are commonly referred to as mezzanine cards. Existing mezzanine cards may use conventional Peripheral Component Interconnect (PCI) as the primary data bus interface to the base or carrier card. Examples of existing or legacy mezzanine cards include a Common Mezzanine Card (CMC), a PCI Mezzanine Card (PMC), a Processor PMC (PrPMC), and a Switched Mezzanine Card (XMC).

An Advanced Mezzanine Card (AMC) is a high-speed hot-swappable mezzanine card designed for, but not limited to, Advanced Telecommunications Computing Architecture (ATCA) carriers. The AMC standard is designed to enhance modularity and high-speed serial connectivity for ATCA and other platforms. AMC cards may use high speed interconnect standards such as PCI Express, which provides a high speed serial connection.

Although the industry may be moving toward the AMC standard, there remains widespread acceptance and use of non-AMC mezzanine cards. AMC is not backward compatible with mezzanine standards based on the CMC specification, and the differences between these types of mezzanine cards may present problems, for example, when adapting legacy mezzanine cards to ATCA carriers. To connect to an AMC connector on an ATCA carrier, for example, legacy mezzanine cards may need to be redesigned to provide the proper connectors and/or bridges.

BRIEF DESCRIPTION OF THE DRAWINGS

Features and advantages of the claimed subject matter will be apparent from the following detailed description of embodiments consistent therewith, which description should be considered with reference to the accompanying drawings, in which:

Although the following detailed description will proceed with reference being made to particular illustrated embodiments, it should be understood that numerous variations and modifications will be apparent to those having skill in the art. Accordingly, the claimed subject matter should be interpreted broadly without limitation to the particular illustrated embodiments herein.

DETAILED DESCRIPTION

Figure 1:
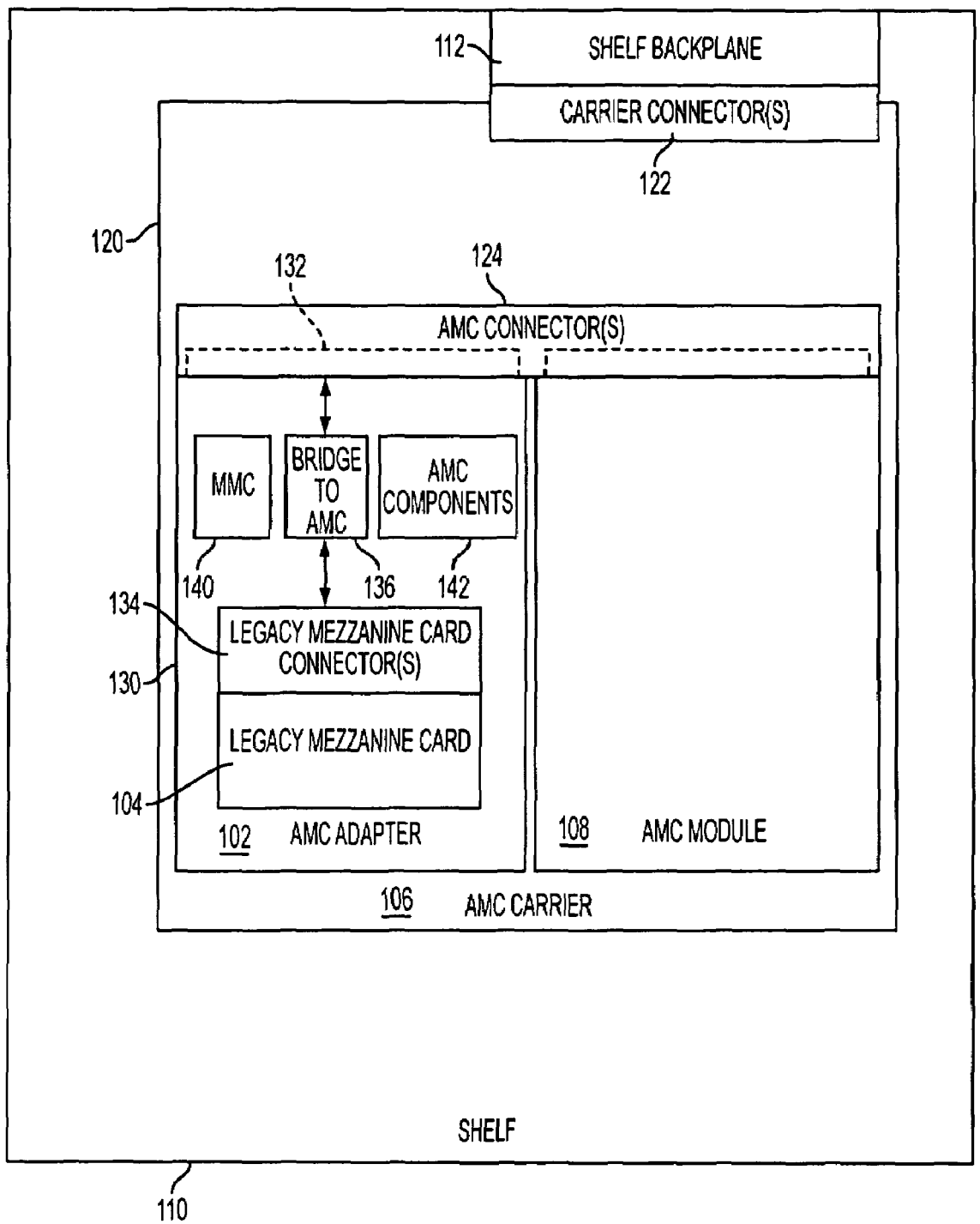
FIG. 1 is a schematic block diagram of a system including an Advanced Mezzanine Card (AMC) adapter connecting a non-AMC mezzanine card to an AMC carrier, consistent with the present disclosure.

Referring to FIG. 1, one embodiment of an Advanced Mezzanine Card (AMC) adapter 102 may be used to connect a non-AMC mezzanine card 104 (also referred to as a legacy mezzanine card) to an AMC carrier 106 that is configured for an AMC module 108. An AMC module 108 may be a modular add-on or "child" card that extends the functionality of an AMC carrier board and complies or is compatible with PCI Industrial Computer Manufacturers Group (PICMG), Advanced Mezzanine Card (AMC) Base Specification, PICMG AMC.0, published Jan. 3, 2005 (the "AMC Specification"). A non-AMC mezzanine card 104 may be a modular add-on or "child" card that does not comply with the AMC Specification. The AMC adapter 102 may provide the physical interconnections and/or protocol conversions to accommodate the non-AMC mezzanine card 104 in an AMC environment.

One or more AMC carriers 106 may be connected within a chassis or shelf 110 of a computer or electronic system such as an advanced telecommunications computing architecture (advanced TCA or ATCA). According to one embodiment, the AMC carrier 106 may be an ATCA carrier board complying with, or compatible with, PICMG Advanced Telecommunications Computing Architecture (ATCA) Base Specification, PIGMG 3.0 Revision 1.0, published Dec. 30, 2002. The AMC adapter 102 may also be used with an AMC carrier 106 in a different type of architecture other than ATCA.

The AMC carrier 106 may include a carrier printed circuit board (PCB) 120 and one or more carrier connectors 122 mounted to the carrier PCB 120. In the exemplary embodiment, the carrier connectors 122 are configured to connect to a shelf backplane 112 in the shelf 110. The AMC carrier 106 may also include one or more AMC connectors 124 mounted to the carrier PCB 120. In this embodiment, the AMC connectors 124 comply or are compatible with the AMC Specification are configured to connect to one or more AMC adapters 102 and/or one or more AMC modules 108. Although the illustrated embodiment shows one AMC adapter 102 and one AMC module 108 connected to the AMC carrier 106, multiple AMC adapters 102 and/or AMC modules 108 may be connected to an AMC carrier.

The AMC adapter 102 may include an adapter printed circuit board (PCB) 130 having a card edge connector 132 configured to connect to one of the AMC connectors 124 on the AMC carrier 106. The AMC adapter 102 may also include one or more legacy mezzanine card connectors 134 mounted on the adapter PCB 130. The legacy mezzanine card connectors 134 may be configured to connect to mating connectors on the non-AMC mezzanine card 104.

The AMC adapter 102 may further include a bridge 136 mounted on the adapter PCB 130 and may be electrically coupled between the mezzanine card connector(s) 134 and the card edge connector 132. The bridge 136 provides conversion between different communication protocols and/or provides interconnection between different bus interface architectures used by the non-AMC mezzanine card 104 and the AMC carrier 106, as will be described in greater detail below.

The AMC adapter 102 may comply or be compatible with the AMC Specification including the mechanical, thermal, power, interconnect, system management and regulatory guidelines specified therein. For example, the AMC adapter 102 may include a management controller 140 which may include circuitry and/or control logic for providing AMC management functions such as hot plug and/or hot swap controller circuitry. The management controller 140 may be a module management controller (MMC) as defined in the AMC Specification, which communicates with the Intelligent Platform Management Controller (IPMC) (not shown) on the AMC carrier 106 using Intelligent Platform Management Interface (IPMI) (not shown) messages over an Intelligent Platform Management Bus (IPMB).

The AMC adapter 102 may also include other AMC components 142 to provide AMC compatibility depending upon the non-AMC mezzanine card 104. One example of such a component 142 is a power converter to convert power supplied according to the AMC Specification to meet the power supply requirements of the non-AMC mezzanine card 104. Those skilled in the art will recognize the types of AMC components 142 that may be needed and how to implement such components 142.

The non-AMC mezzanine card 104 may be any non-AMC mezzanine card complying with or compatible with a mezzanine card standard other than the AMC standard. Such non-AMC standards and non-AMC mezzanine cards include, but are not limited to, the IEEE-P1386 Common Mezzanine Card (CMC), the IEEE Std P1386.1-2001 PCI Mezzanine Card (PMC), the ANSI/VITA 32-2003 Processor PMC (PrPMC), and the VITA-42 Switched Mezzanine Card (XMC). The non-AMC mezzanine card 104 may have various uses including, but not limited to, telecommunication connectivity, processors, network processors, and mass storage devices.

In one embodiment, the non-AMC mezzanine card 104 supports a PCI parallel bus architecture that complies with, for example, Conventional Peripheral Component Interconnect (PCI) Local Bus Specification Revision 3.0, published Feb. 3, 2004 (the "PCI Specification") and the AMC carrier 106 supports a PCI Express serial bus architecture that complies with, for example, Peripheral Component Interconnect (PCI) Express Base Specification Revision 1.0, published Jul. 22, 2002 (the. "PCI Express Specification"). In this embodiment, the bridge 136 may be a PCI-to-PCI Express Bridge such as the Intel® 41210 Serial to Parallel PCI Bridge available from Intel Corporation.

The bridge 136 may also provide interconnection between other bus architectures and/or conversion between other communication protocols. For example, the AMC adapter 102 may be configured to connect to other non-AMC mezzanine cards 104 that do not necessarily support PCI. The AMC adapter 102 may also connect to AMC carriers 106 that support other interconnect or interface standards, such as System Packet Interface (SPI-3/SPI-4.2), Advanced Switching Interconnect (ASI), RapidIO, Serial RapidIO, Ethernet, Gigabit Ethernet, and Fibre Channel. Those skilled in the art will recognize the type of bridge that may be used based on the bus interface architectures and/or communication protocols supported by the non-AMC mezzanine card 104 and the AMC carrier 106.

Figure 2:
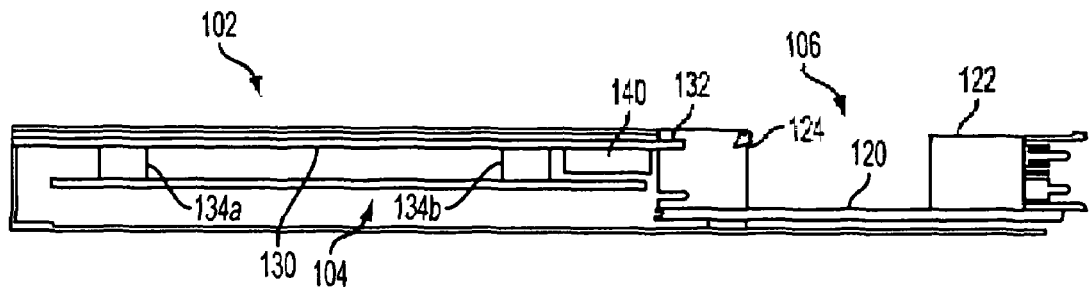
FIG. 2 is a cross-sectional view of one embodiment of an AMC adapter connecting a non-AMC mezzanine card to an AMC carrier, consistent with the present disclosure.
Figure 3:
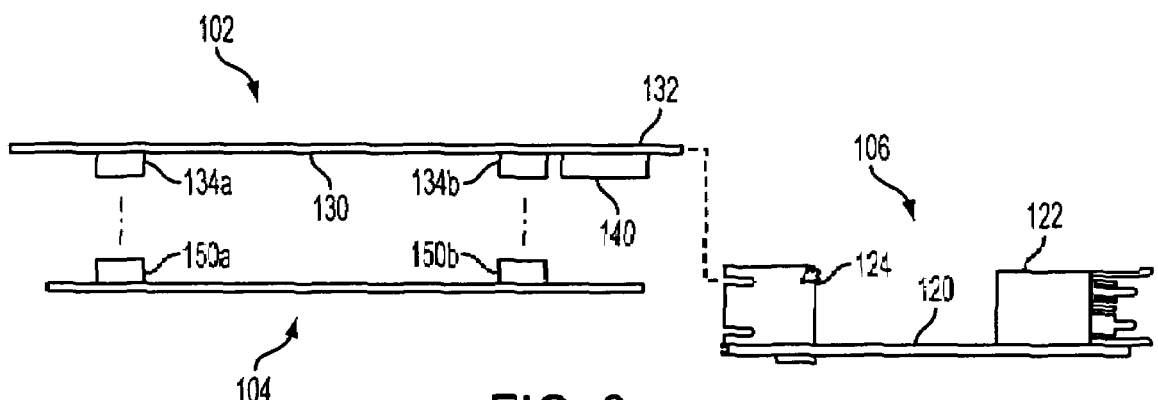
FIG. 3 is an exploded view of the AMC adapter, non-AMC mezzanine card and AMC carrier shown in FIG. 2.
Figure 4:
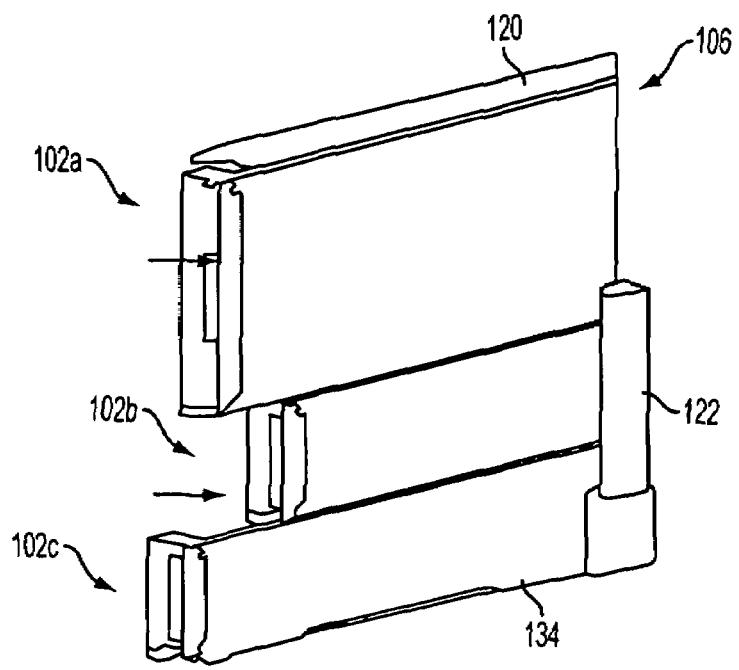
FIG. 4 is a perspective view of AMC adapters having different form factors connected to an AMC carrier, consistent with the present disclosure.

Referring to FIGS. 2-4, an embodiment of the AMC adapter 102 is shown in greater detail. In this embodiment, the non-AMC mezzanine card 104 is connected to mezzanine connectors 134a, 134b on the AMC adapter 102 and the card edge connector 132 of the AMC adapter 102 is plugged into the AMC connector 124 on the AMC carrier 106. When connected, the AMC adapter 102, the non-AMC mezzanine card 104, and the AMC carrier 106 may be oriented in a generally parallel configuration.

The mezzanine card connectors 134a, 134b may be mounted on the adapter PCB 130 and positioned such that the connectors 134a, 134b are aligned with mating connectors 150a, 150b on the non-AMC mezzanine card 104 (FIG. 3). In one embodiment where the non-AMC mezzanine card 104 is a PMC mezzanine, the mezzanine card connectors 134a, 134b may include MICTOR connectors (i.e., matched impedance connectors). Those skilled in the art will recognize that the AMC adapter 102 may include any type of mezzanine card connector(s) depending upon the type of non-AMC mezzanine card 104 being connected to the AMC adapter 102.

The AMC carrier 106 may be configured as a conventional carrier, a cutaway carrier, or a hybrid carrier, as defined by the AMC Specification. The AMC connector 124 may be an AB type connector supporting a two layer connection (as shown in FIGS. 2 and 3) or a B type connector supporting a single layer connection, as defined by the AMC Specification. The AMC connector 124 may also be configured as a basic connector or an extended connector, as defined by the AMC Specification.

The card edge connector 132 may include conductive traces at the edge of the adapter PCB 130, as defined by the AMC Specification, which mate with the AMC connector 124 on the carrier 106. The conductive traces may be located on one side of the adapter PCB 130 (e.g., to connect to a basic AMC connector) or on both sides of the adapter PCB 130 (e.g., to connect to an extended AMC connector).

The AMC adapter 102 including the adapter PCB 130, the mezzanine connectors 134a, 134b, the management controller 140 and other components may be configured and positioned to comply with the form factors defined by the AMC Specification. For example, the AMC adapter 102 may comply with either the full-height or half-height form factors. Although FIG. 2 shows the AMC adapter 102 inserted into the upper bay of the AMC connector 124 (i.e., oriented in the B layer), the AMC adapter.102 may also be inserted into the lower bay of the AMC connector 124 (i.e., oriented in the A layer). Alternatively, AMC adapters 102 may be inserted into both of the bays of the AMC connector 124, which is shown as an AB type connector.

The AMC adapter 102 may comply with either the single wide or dual wide form factors, as defined by the AMC Specification. For example, a dual wide AMC adapter 102a and single wide AMC adapters 102b, 102c may be connected to the AMC carrier 106 (FIG. 4.) Alternatively, four single wide AMC adapters (not shown) may be connected to the AMC carrier 106.

Figure 5:
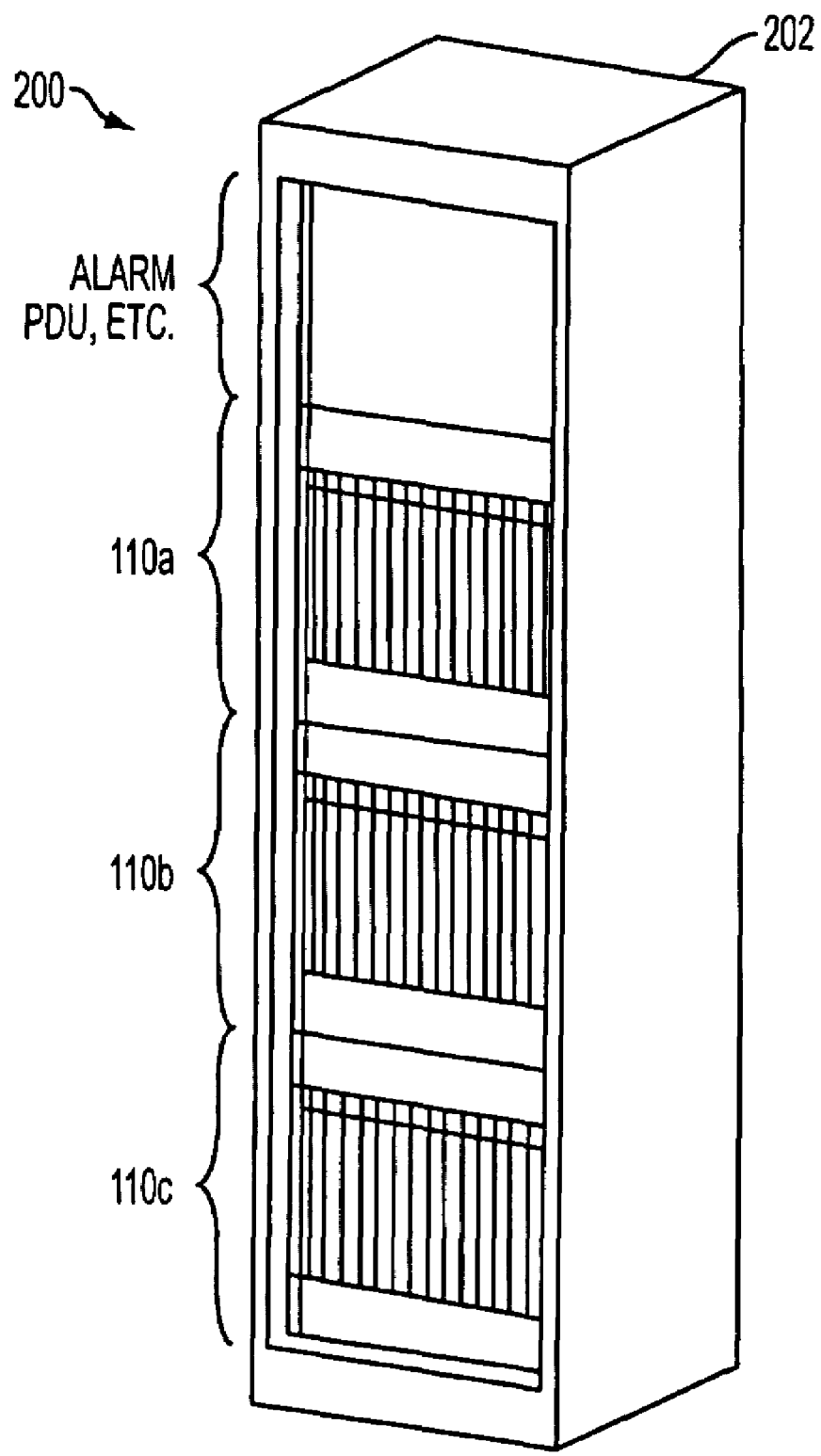
FIG. 5 is a schematic illustration of a system including a frame and one or more shelves, consistent with the present disclosure.

Referring to FIG. 5, a system 200 may include one or more chassis or shelves 110a, 110b, 110c within a frame 202. One or more of the chassis or shelves 110a, 110b, 110c may include at least one AMC carrier, AMC adapter and non-AMC mezzanine card, consistent with any embodiment described herein. The frame 202 may include, for example, a power supply for providing power to each of the individual chassis or shelves 110a, 110b, 110c disposed in the frame 202. Additionally, as mentioned above, the frame may electrically couple one or more of the chassis or shelves 110a, 110b, 110c to at least one other chassis or shelf.

According to an alternative embodiment, rather than being disposed in a common frame, a system consistent with the present disclosure may include a plurality of chassis or shelves that may be individually hardwired to one another. One or more of the plurality of chassis or shelves may include at least one AMC carrier, AMC adapter and non-AMC mezzanine card, consistent with any embodiment described herein. Additionally, each of the plurality of chassis or shelves may be powered by an individual power supply and/or may be separately powered by a common power supply. Such a system may, therefore, provide a greater freedom in the physical arrangement and interrelation of the plurality of chassis or shelves.

In at least one embodiment, an AMC adapter may be used to connect a non-AMC mezzanine card to an AMC carrier. The AMC adapter may include a printed circuit board including at least one card edge connector configured to connect to an AMC connector on the AMC carrier and at least one mezzanine card connector disposed on the printed circuit board to connect to connectors on the non-AMC mezzanine card. A bridge may be electrically coupled between the mezzanine card connector and the card edge connector to convert between different communication protocols used by the non-AMC mezzanine card and the AMC carrier. A management controller may be electrically coupled between the mezzanine card connector and the card edge connector to communicate with the AMC carrier.

A system may include a frame with at least one shelf and at least one AMC carrier at least partially disposed in the shelf. At least one AMC adapter is configured to be connected to an AMC connector on the AMC carrier, and at least one non-AMC mezzanine card is configured to be connected to a mezzanine card connector on the AMC adapter.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An Advanced Mezzanine Card (AMC) adapter for use with an AMC carrier, said AMC adapter comprising:
    a printed circuit board including at least one card edge connector configured to connect to an AMC connector on said AMC carrier;
    at least one mezzanine card connector disposed on said printed circuit board, said at least one mezzanine card connector being configured to connect to connectors on a non-AMC mezzanine card;
    a management controller electrically coupled between said mezzanine card connector and said card edge connector, said management controller being capable of communicating with said AMC carrier; and
    a bridge electrically coupled between said mezzanine card connector and said card edge connector, said bridge being capable of converting between different communication protocols used by said non-AMC mezzanine card and said AMC carrier.

2. The AMC adapter of claim 1 wherein said bridge includes a PCI-to-PCI Express bridge.

3. The AMC adapter of claim 1 wherein said bridge interconnects a parallel bus architecture of said non-AMC mezzanine card and a serial bus architecture of said AMC carrier.

4. The AMC adapter of claim 1 further comprising at least a power converter configured to convert power provided by said AMC carrier to power requirements of said non-AMC mezzanine card.

5. The AMC adapter of claim 1 wherein said at least one mezzanine card connector includes at least one matched impedance connector configured to be connected to a PMC mezzanine card.

6. The AMC adapter of claim 1 wherein said at least one mezzanine card connector is configured to connect to a non-AMC mezzanine card selected from the group consisting of a Common Mezzanine Card (CMC), a PCI Mezzanine Card (PMC), a Processor PMC (PrPMC), and a Switched Mezzanine Card (XMC).

7. A system comprising:
    a frame comprising at least one shelf;
    at least one AMC carrier at least partially disposed in said shelf, said AMC carrier including an AMC connector;
    at least one AMC adapter configured to be connected to said AMC connector on said AMC carrier, said AMC adapter including at least one mezzanine card connector;
    at least one non-AMC mezzanine card configured to be connected to said mezzanine card connector on said AMC adapter; and
    a bridge coupled to said at least one AMC adapter, said bridge capable of converting between communication protocols used by said non-AMC mezzanine card and said AMC carrier.

8. The system of claim 7 wherein said AMC adapter comprises a management controller capable of managing communications with said AMC carrier.

9. The system of claim 7 wherein said AMC adapter comprises a printed circuit board including at least one card edge connector configured to connect to said AMC connector on said AMC carrier.

10. The system of claim 7 wherein said AMC carrier board supports PCI Express.

11. The system of claim 10 wherein said non-AMC mezzanine card supports PCI.

12. The system of claim 11 wherein said AMC adapter comprises a PCI-to-PCI Express bridge capable of providing conversion between communication protocols used by said non-AMC mezzanine card and said AMC carrier.

13. The system of claim 7 wherein said AMC carrier is an advanced telecommunications computing architecture (ATCA) carrier board.

14. The system of claim 7 wherein said non-AMC mezzanine card is selected from the group consisting of a Common Mezzanine Card (CMC), a PCI Mezzanine Card (PMC), a Processor PMC (PrPMC), and a Switched Mezzanine Card (XMC).

15. The system of claim 7 wherein said AMC adapter comprises:
    a printed circuit board including at least one card edge connector configured to connect to an AMC connector on said AMC carrier;
    at least one mezzanine card connector disposed on said printed circuit board, said at least one mezzanine card connector being configured to connect to connectors on a non-AMC mezzanine card;
    a bridge electrically coupled between said mezzanine card connector and said card edge connector, said bridge being capable of converting between communication protocols used by said non-AMC mezzanine card and said AMC carrier; and
    a management controller electrically coupled between said mezzanine card connector and said card edge connector, said management controller being capable of communicating with said AMC carrier.

16. A method comprising:
connecting a non-AMC mezzanine card to an AMC adapter, said AMC adapter including a printed circuit board including at least one card edge connector configured to connect to an AMC connector on an AMC carrier, said AMC adapter further including at least one mezzanine card connector disposed on said printed circuit board, said at least one mezzanine card connector being configured to connect to connectors on said non-AMC mezzanine card, said AMC adapter further including a bridge electrically coupled between said mezzanine card connector and said card edge connector, said bridge being capable of converting between different communication protocols used by said non-AMC mezzanine card and said AMC carrier;
connecting said AMC adapter to said AMC carrier; and
connecting said AMC carrier to a backplane in a shelf.

17. The method of claim 16 wherein said non-AMC mezzanine card is selected from the group consisting of a Common Mezzanine Card (CMC), a PCI Mezzanine Card (PMC), a Processor PMC (PrPMC), and a Switched Mezzanine Card (XMC).

18. The method of claim 16 wherein said AMC adapter further comprises:
a management controller electrically coupled between said mezzanine card connector and said card edge connector, said management controller being capable of communicating with said AMC carrier.

19. The method of claim 16 wherein said shelf is an advanced telecommunications computing architecture (ATCA) shelf, and said AMC carrier is an ATCA carrier board.

* * * * *